United States Patent
Zhang et al.

(10) Patent No.: US 11,196,011 B2
(45) Date of Patent: Dec. 7, 2021

(54) FLEXIBLE DISPLAY PANEL WITH BENT SUBSTRATE

(71) Applicant: Apple Inc., Cupertino, CA (US)

(72) Inventors: Zhen Zhang, San Jose, CA (US); Yi Tao, San Jose, CA (US); Paul S. Drzaic, Morgan Hill, CA (US); Joshua G. Wurzel, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 268 days.

(21) Appl. No.: 15/476,812

(22) Filed: Mar. 31, 2017

(65) Prior Publication Data

US 2017/0263873 A1    Sep. 14, 2017

Related U.S. Application Data

(63) Continuation of application No. 14/987,129, filed on Jan. 4, 2016, now Pat. No. 9,614,168.
(Continued)

(51) Int. Cl.
*H01L 51/00* (2006.01)
*H01L 23/498* (2006.01)
(Continued)

(52) U.S. Cl.
CPC ...... *H01L 51/0097* (2013.01); *H01L 23/4985* (2013.01); *H01L 23/5387* (2013.01);
(Continued)

(58) Field of Classification Search
CPC .............. H01L 27/326; H01L 23/5387; H01L 23/4985; H01L 51/0097
See application file for complete search history.

(56) References Cited

U.S. PATENT DOCUMENTS 4,507,170 A    3/1985  Myhre
5,694,190 A    12/1997 Matsumoto et al.
(Continued)

FOREIGN PATENT DOCUMENTS

CN    101910966    12/2010
CN    102568377    7/2012
(Continued)

OTHER PUBLICATIONS

Raff et al, U.S. Appl. No. 15/016,772, filed Feb. 5, 2016.

*Primary Examiner* — Phat X Cao
(74) *Attorney, Agent, or Firm* — Treyz Law Group, P.C.; G. Victor Treyz; Kendall P. Woodruff (57) ABSTRACT

A display may have an array of organic light-emitting diodes that form an active area on a flexible substrate. Metal traces may extend between the active area and an inactive area of the flexible substrate. Display driver circuitry such as a display driver integrated circuit may be coupled to the inactive area. The metal traces may extend across a bend region in the flexible substrate. The flexible substrate may be bent in the bend region. The flexible substrate may be made of a thin flexible material to reduce metal trace bending stress. A coating layer in the bend region may be provided with an enhanced elasticity to allow its thickness to be reduced. The flexible substrate may be bent on itself and secured within an electronic device without using a mandrel.

18 Claims, 10 Drawing Sheets

Related U.S. Application Data (60) Provisional application No. 62/102,284, filed on Jan. 12, 2015.

(51) Int. Cl.
    *H01L 23/538*    (2006.01)
    *H01L 27/32*     (2006.01)
    *H01L 51/52*     (2006.01)

(52) U.S. Cl.
    CPC ........ *H01L 27/326* (2013.01); *H01L 27/3276* (2013.01); *H01L 51/004* (2013.01); *H01L 51/5253* (2013.01); *H01L 2251/5338* (2013.01); *H01L 2251/558* (2013.01); *Y02E 10/549* (2013.01)

(56) References Cited

U.S. PATENT DOCUMENTS

| | | | |
|---|---|---|---|
| 5,717,556 | A | 2/1998 | Yanagida |
| 5,777,855 | A | 7/1998 | Yokajty |
| 6,104,464 | A | 8/2000 | Adachi et al. |
| 6,201,346 | B1 | 3/2001 | Kusaka |
| 6,483,714 | B1 | 11/2002 | Kabumoto et al. |
| 6,498,592 | B1 | 12/2002 | Matthies |
| 6,633,134 | B1 | 10/2003 | Kondo |
| 6,717,057 | B1 | 4/2004 | Segall et al. |
| 7,816,856 | B2 | 10/2010 | Cok et al. |
| 8,106,309 | B2 | 1/2012 | Hwang |
| 8,319,725 | B2 | 11/2012 | Okamoto et al. |
| 8,434,909 | B2 | 5/2013 | Nichol et al. |
| 8,492,969 | B2 | 7/2013 | Lee et al. |
| 8,723,824 | B2 | 5/2014 | Myers et al. |
| 8,724,304 | B2 | 5/2014 | Raff et al. |
| 8,804,347 | B2 | 8/2014 | Martisauskas |
| 8,976,141 | B2 | 3/2015 | Myers et al. |
| 9,209,207 | B2 | 12/2015 | Park et al. |
| 9,256,250 | B2 | 2/2016 | Raff et al. |
| 9,356,087 | B1 * | 5/2016 | Lee .................... H01L 27/3276 |
| 2002/0097352 | A1 | 7/2002 | Houdeau |
| 2005/0078099 | A1 | 4/2005 | Amundson et al. |
| 2005/0212419 | A1 | 9/2005 | Vazan et al. |
| 2006/0231844 | A1 | 10/2006 | Carter |
| 2008/0024060 | A1 | 1/2008 | Jonnalagadda et al. |
| 2008/0241549 | A1 | 10/2008 | Seon et al. |
| 2008/0248191 | A1 | 10/2008 | Daniels |
| 2009/0021666 | A1 | 1/2009 | Chen |
| 2009/0148678 | A1 | 6/2009 | Hwang |
| 2009/0189835 | A1 | 7/2009 | Kim et al. |
| 2010/0148654 | A1 | 6/2010 | Yan et al. |
| 2010/0308335 | A1 | 12/2010 | Kim et al. |
| 2010/0308355 | A1 | 12/2010 | Hsieh et al. |
| 2011/0007042 | A1 | 1/2011 | Miyaguchi |
| 2011/0241563 | A1 | 10/2011 | Kim et al. |
| 2012/0146886 | A1 | 6/2012 | Minami et al. |
| 2012/0208306 | A1 | 8/2012 | Haas et al. |
| 2012/0307423 | A1 | 12/2012 | Bohn et al. |
| 2013/0026505 | A1 | 1/2013 | Lee et al. |
| 2013/0081756 | A1 | 4/2013 | Franklin et al. |
| 2013/0112984 | A1 | 5/2013 | Kim et al. |
| 2013/0180882 | A1 | 7/2013 | Hamers et al. |
| 2013/0342439 | A1 | 12/2013 | Kwack et al. |
| 2014/0016284 | A1 | 1/2014 | Hack et al. |
| 2014/0042406 | A1 | 2/2014 | Degner et al. |
| 2014/0092338 | A1 | 4/2014 | Miyazaki et al. |
| 2014/0131897 | A1 * | 5/2014 | Yu ....................... H01L 23/4985 257/783 |
| 2014/0184057 | A1 | 7/2014 | Kim et al. |
| 2014/0203703 | A1 | 7/2014 | Maatta |
| 2014/0217382 | A1 | 8/2014 | Kwon et al. |
| 2014/0239276 | A1 | 8/2014 | Lin et al. |
| 2014/0240985 | A1 | 8/2014 | Kim et al. |
| 2014/0267950 | A1 | 9/2014 | Kang et al. |
| 2014/0299884 | A1 | 10/2014 | Park et al. |
| 2014/0306941 | A1 * | 10/2014 | Kim ....................... G06F 1/1652 345/204 |
| 2014/0333858 | A1 | 11/2014 | Martisauskas |
| 2015/0036300 | A1 * | 2/2015 | Park ....................... H05K 1/147 361/749 |
| 2015/0091434 | A1 | 4/2015 | Kim |
| 2015/0130767 | A1 | 5/2015 | Myers et al. |
| 2015/0227227 | A1 | 8/2015 | Myers et al. |
| 2015/0230331 | A1 | 8/2015 | Lee |
| 2015/0363030 | A1 | 12/2015 | Nam et al. |

FOREIGN PATENT DOCUMENTS

| | | |
|---|---|---|
| CN | 103178083 | 6/2013 |
| CN | 103594485 | 2/2014 |
| CN | 103748538 | 4/2014 |
| CN | 103996690 | 8/2014 |
| CN | 104103669 A | 10/2014 |
| CN | 205680685 U | 11/2016 |
| EP | 1533852 | 5/2005 |
| JP | 2006349788 A | 12/2006 |
| JP | 2008033095 | 2/2008 |
| JP | 2009094099 | 4/2009 |
| JP | 2012128006 | 7/2012 |
| KR | 1020130076402 A | 7/2013 |
| KR | 1020140099174 A | 8/2014 |
| KR | 1020140122595 A | 10/2014 |
| TW | 548185 | 8/2003 |
| TW | 201002125 | 1/2010 |
| TW | 201044899 | 12/2010 |
| TW | M429927 | 5/2012 |
| TW | 201229179 | 7/2012 |
| TW | 201419973 | 5/2014 |
| TW | 201440582 | 10/2014 |
| WO | 2000027172 A1 | 5/2000 |
| WO | 2008001051 | 1/2008 |
| WO | 2012078040 | 6/2012 |
| WO | 2014/025534 | 2/2014 |

* cited by examiner

FLEXIBLE DISPLAY PANEL WITH BENT SUBSTRATE

This application is a continuation of patent application Ser. No. 14/987,129, filed Jan. 4, 2016, which claims the benefit of provisional patent application No. 62/102,284, filed Jan. 12, 2015, both of which are hereby incorporated by reference herein in their entireties. This application claims the benefit of and claims priority to patent application Ser. No. 14/987,129, filed Jan. 4, 2016, which claims the benefit of provisional patent application No. 62/102,284, filed Jan. 12, 2015.

BACKGROUND

This relates generally to electronic devices with displays, and, more particularly, to displays with bent portions.

Electronic devices often include displays. Displays such as organic light-emitting diode displays may be formed on flexible substrates. Displays with flexible substrates may be bent. For example, it may be desirable to bend an edge of a display to hide inactive display components along the edge of the display from view.

The process of bending a display can create stresses within the structures of the display. For example, bent metal traces may become stressed. Stress-induced damage such as cracks may adversely affect display reliability.

It would therefore be desirable to be able to provide improved displays with bent portions.

SUMMARY

A display may have an array of organic light-emitting diodes that form an active area on a flexible substrate. Metal traces may extend between the active area and an inactive area of the flexible substrate. Display driver circuitry such as a display driver integrated circuit may be coupled to the inactive area. The metal traces may extend across a bend region in the flexible substrate. The flexible substrate may be bent in the bend region.

The flexible substrate may be made of a thin flexible material to reduce metal trace bending stress. A coating layer in the bend region may be provided with an enhanced elasticity to allow its thickness to be reduced. The flexible substrate may be bent on itself and secured within an electronic device without using a mandrel.

DETAILED DESCRIPTION

Figure 1:
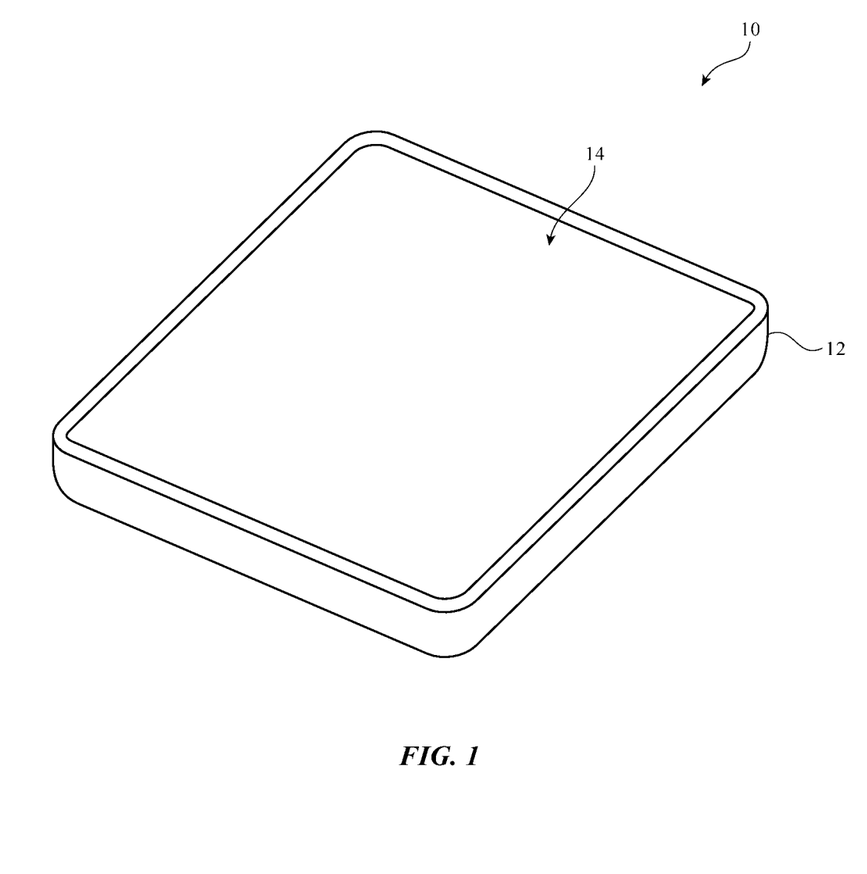
FIG. 1 is a perspective view of an illustrative electronic device having a display in accordance with an embodiment.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, wrist device, or other portable computing device. Other configurations may be used for device 10 if desired. The example of FIG. 1 is merely illustrative.

In the example of FIG. 1, device 10 includes a display such as display 14 mounted in housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Display 14 may include an array of display pixels formed from liquid crystal display (LCD) components, an array of electrophoretic display pixels, an array of plasma display pixels, microelectromechanical (MEMs) shutter pixels, electrowetting pixels, micro-light-emitting diodes (small crystalline semiconductor die), organic light-emitting diodes (e.g., a thin-film organic light-emitting diode display), quantum dot light-emitting diodes, or display pixels based on other display technologies. The array of display pixels may display images for a user in active area of display 14. The active area may be surrounded on one or more sides by inactive border regions.

Display 14 may be protected using a display cover layer such as a layer of transparent glass or clear plastic. Openings may be formed in the display cover layer. For example, an opening may be formed in the display cover layer to accommodate a button, a speaker port, or other component. Openings may be formed in housing 12 to form communications ports (e.g., an audio jack port, a digital data port, etc.), to form openings for buttons, etc.

Figure 2:
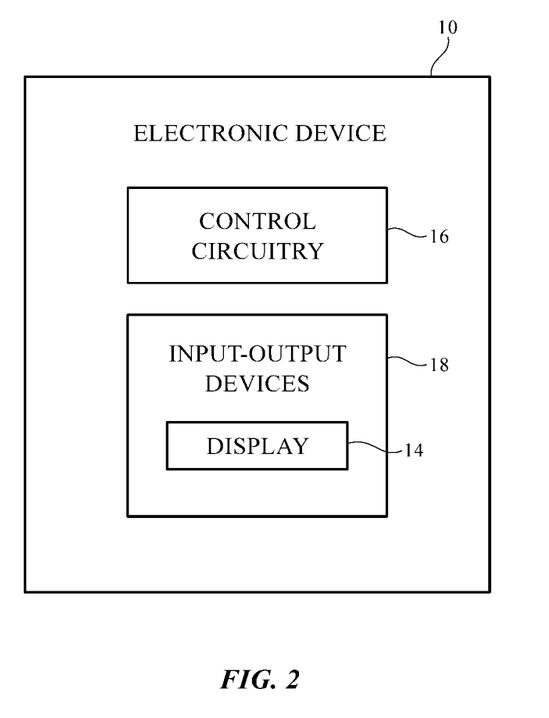
FIG. 2 is a schematic diagram of an illustrative electronic device having a display in accordance with an embodiment.

FIG. 2 is a schematic diagram of device 10. As shown in FIG. 2, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 18 may be used to allow data to be supplied to device 10 and to allow data to be provided from device 10 to external devices. Input-output devices 18 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 18 and may receive status information and other output from device 10 using the output resources of input-output devices 18. Input-output devices 18 may include one or more displays such as display 14.

Control circuitry 16 may be used to run software on device 10 such as operating system code and applications. During operation of device 10, the software running on control circuitry 16 may display images on display 14 using an array of pixels in display 14.

Display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 3:
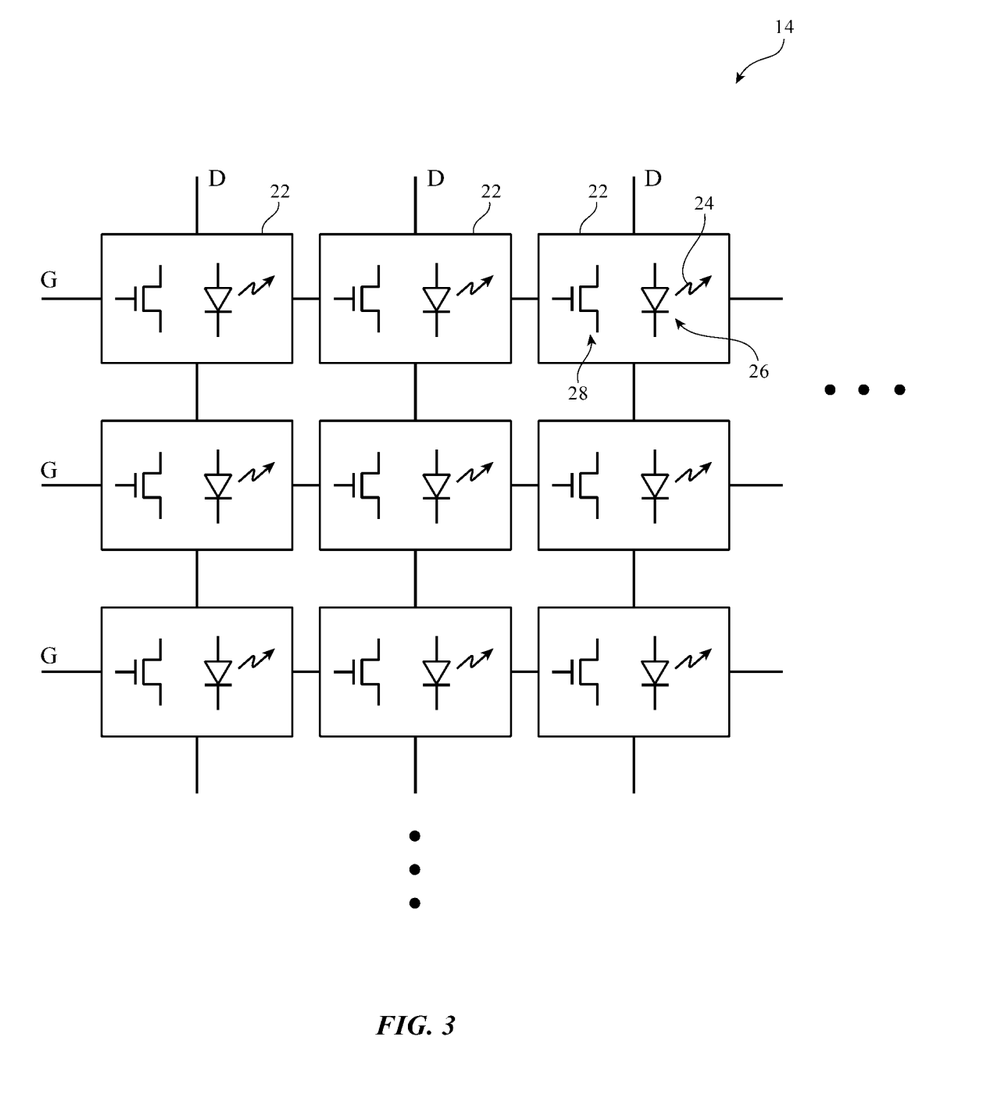
FIG. 3 is a top view of an illustrative display in an electronic device in accordance with an embodiment.

A top view of a portion of display 14 is shown in FIG. 3. As shown in FIG. 3, display 14 may have an array of pixels 22. Pixels 22 may receive data signals over signal paths such as data lines D and may receive one or more control signals over control signal paths such as horizontal control lines G (sometimes referred to as gate lines, scan lines, emission control lines, etc.). There may be any suitable number of rows and columns of pixels 22 in display 14 (e.g., tens or more, hundreds or more, or thousands or more). Each pixel 22 may have a light-emitting diode 26 that emits light 24 under the control of a pixel control circuit formed from thin-film transistor circuitry such as thin-film transistors 28 and thin-film capacitors). Thin-film transistors 28 may be polysilicon thin-film transistors, semiconducting-oxide thin-film transistors such as indium zinc gallium oxide transistors, or thin-film transistors formed from other semiconductors.

Figure 4:
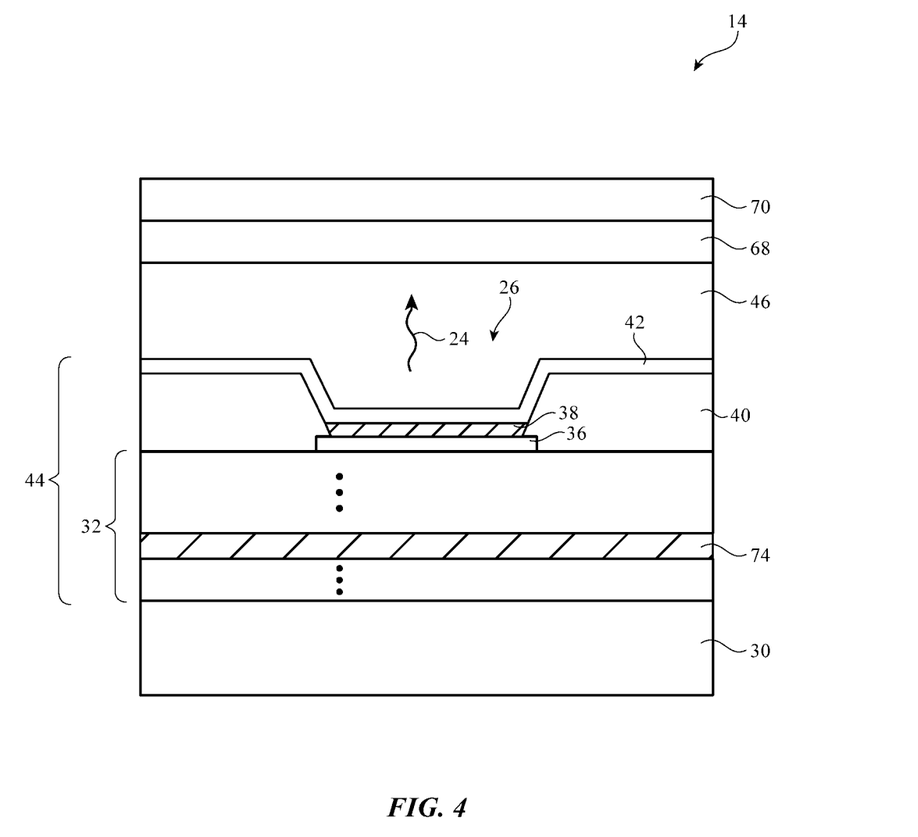
FIG. 4 is a cross-sectional side view of a portion of an illustrative organic light-emitting diode display in accordance with an embodiment.

A cross-sectional side view of a portion of an illustrative organic light-emitting diode display in the vicinity of one of light-emitting diodes 26 is shown in FIG. 4. As shown in FIG. 4, display 14 may include a substrate layer such as substrate layer 30. Substrate 30 may be formed from plastic or other suitable materials. Configurations for display 14 in which substrate 30 has been formed from a flexible material such as polyimide or other flexible polymer are sometimes described herein as an example.

Thin-film transistor circuitry 44 may be formed on substrate 30. Thin film transistor circuitry 44 may include layers 32. Layers 32 may include inorganic layers such as inorganic buffer layers, gate insulator, passivation, interlayer dielectric, and other inorganic dielectric layers. Layers 32 may also include organic dielectric layers such as a polymer planarization layer. Metal layers and semiconductor layers may also be included within layers 32. For example, semiconductors such as silicon, semiconducting-oxide semiconductors, or other semiconductor materials may be used in forming semiconductor channel regions for thin-film transistors 28. Metal in layers 32 may be used in forming transistor gate terminals, transistor source-drain terminals, capacitor electrodes, and metal interconnects.

As shown in FIG. 4, thin-film transistor circuitry 44 may include diode anode structures such as anode 36. Anode 36 may be formed from a layer of conductive material such as metal on the surface of layers 32 (e.g., on the surface of a planarization layer that covers underlying thin-film transistor structures). Light-emitting diode 26 may be formed within an opening in pixel definition layer 40. Pixel definition layer 40 may be formed from a patterned photoimageable polymer such as polyimide. In each light-emitting diode, organic emissive material 38 is interposed between a respective anode 36 and cathode 42. Anodes 36 may be patterned from a layer of metal. Cathode 42 may be formed from a common conductive layer that is deposited on top of pixel definition layer 40. Cathode 42 is transparent so that light 24 may exit light emitting diode 26. During operation, light-emitting diode 26 may emit light 24.

Metal interconnect structures may be used to interconnect transistors and other components in circuitry 44. Metal interconnect lines may also be used to route signals to capacitors, to data lines D and gate lines G, to contact pads (e.g., contact pads coupled to gate driver circuitry), and to other circuitry in display 14. As shown in FIG. 4, layers 32 may include one or more layers of patterned metal for forming interconnects such as metal traces 74.

If desired, display 14 may have a protective outer display layer such as cover glass layer 70. The outer display layer may be formed from a material such as sapphire, glass, plastic, clear ceramic, or other transparent material. Protective layer 46 may cover cathode 42. Layer 46 may include moisture barrier structures, encapsulant materials, adhesive, and/or other materials to help protect thin-film transistor circuitry. Functional layers 68 may be interposed between layer 46 and cover layer 70. Functional layers 68 may include a touch sensor layer, a circular polarizer layer, and other layers. A circular polarizer layer may help reduce light reflections from metal traces in thin-film transistor circuitry 44. A touch sensor layer may be formed from an array of capacitive touch sensor electrodes on a flexible polymer substrate. The touch sensor layer may be used to gather touch input from the fingers of a user, from a stylus, or from other external objects. Layers of optically clear adhesive may be used to attach cover glass layer 70 and functional layers 68 to underlying display layers such as layer 46, thin-film transistor circuitry 44, and substrate 30.

Display 14 may have an active area in which pixels 22 form images for viewing by a user of device 10. The active area may have a rectangular shape. Inactive portions of display 14 may surround the active area. For example, signal traces and other support circuitry such as thin-film display driver circuitry may be formed along one or more of the four edges of display 14 that run around the rectangular periphery of display 14 adjacent to the active area. If desired, one or more display driver integrated circuits may be mounted to substrate 30 in the inactive border. For example, a flexible printed circuit on which one or more display driver integrated circuits have been mounted using solder may be attached to the border of display 14. This type of configuration is sometimes referred to as a chip-on-flex configuration and allows display driver circuitry to supply signals to the data and gate lines on display 14.

To minimize the amount of the inactive border area of display 14 that is visible to a user, one or more edges of display 14 may be bent. As an example, the edge of display 14 to which a display driver circuit is mounted using a chip-on-flex arrangement may be folded under the active area of display 14. This helps minimize visible display borders and reduces the footprint of display 14.

Figure 5:
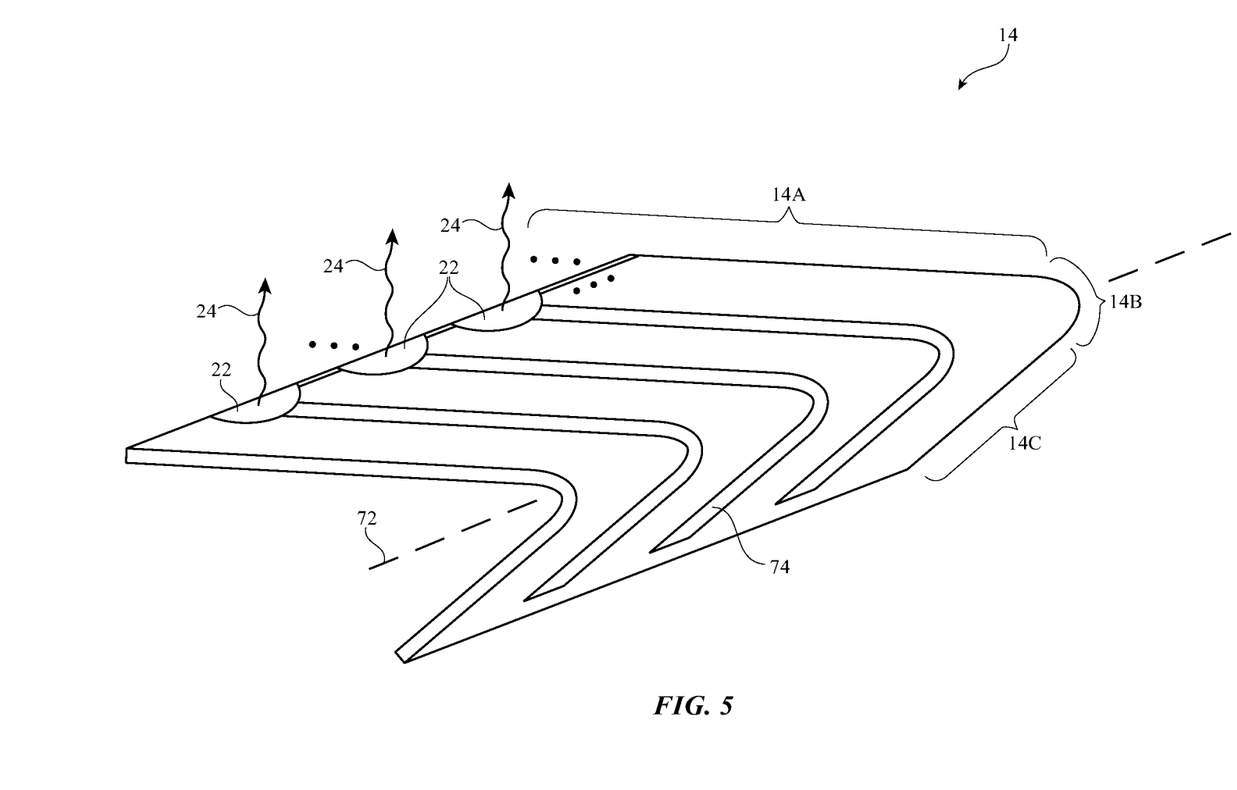
FIG. 5 is perspective view of an illustrative display with a bent portion in accordance with an embodiment.

An illustrative display with a bent edge portion is shown in FIG. 5. As shown in FIG. 5, display 14 has portion 14A (i.e., a planar active area portion that contains the active area of display 14 that is formed by an array of pixels 22), bent portion 14B, and inactive portion 14C. If desired, connectors, display driver integrated circuits or other integrated circuits, flexible printed circuits, and/or other components may be mounted to inactive portion 14C of display 14.

Figure 6:
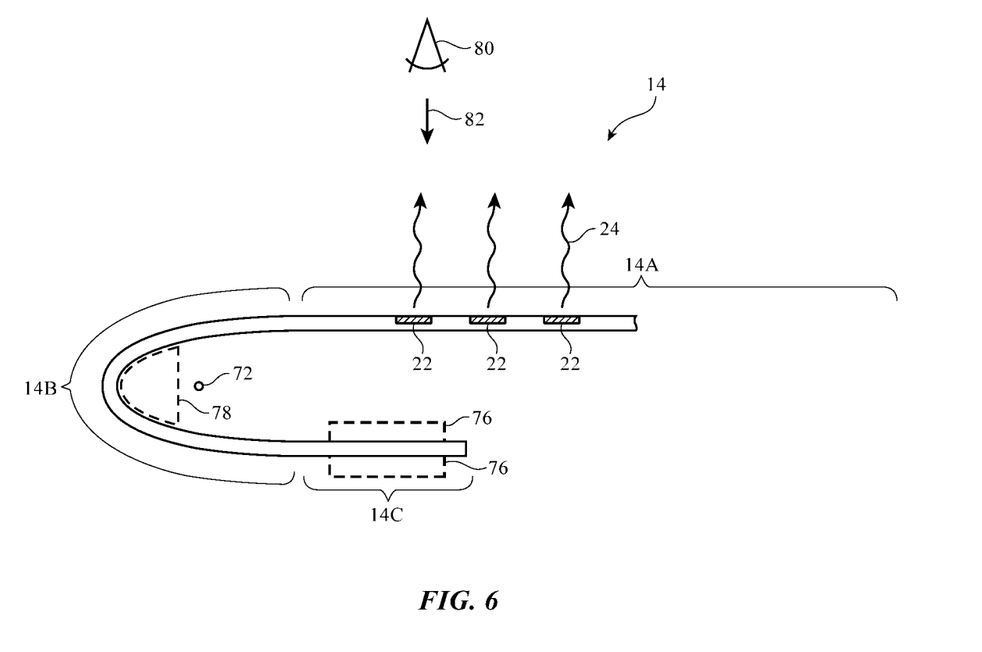
FIG. 6 is a cross-sectional side view of an illustrative display with a bent portion in accordance with an embodiment.

Metal traces 74 may carry signals between inactive area 14C of display 14 and active area 14A of display 14 (i.e., metal traces 74 may traverse bent portion 14B of display 14). As shown in the cross-sectional side view of the illustrative display of FIG. 6, when bent portion 14B is bent around bend axis 72, portion 14C is folded under portion 14A and is therefore hidden from view by a user such as viewer 80 who is viewing display 14 in direction 82. As shown in FIG. 6, components 76 (e.g., display driver circuitry, etc.) may be mounted on the upper and/or lower surface of display 14 in region 14C. An optional support structure such as mandrel 78 may be used to support display 14 in bend region 14B (e.g., to help establish a desired minimum bend radius in region 14B) or, more preferably, mandrel 78 may be omitted to help minimize display thickness (e.g., by allowing portions 14A and 14C to be mounted more closely together and by allowing the bend radius for region 14B to be reduced).

When bending display 14 in region 14B, care should be taken to ensure that sensitive display structures do not become damaged. Stresses can be imparted to display structures in a flexible display when the display is bent. For example, metal traces such as metal traces 74 of FIG. 5 that are used to form signal lines that convey signals between display driver circuitry or other circuits in inactive region 14C and pixels 22 in region 14A may be subjected to bending stresses in bend region 14B. To minimize bending stress and thereby minimize cracks in metal traces 74, it may be desirable to align the neutral stress plane of display 14 in bend region 14B with metal traces 74.

Figure 7:
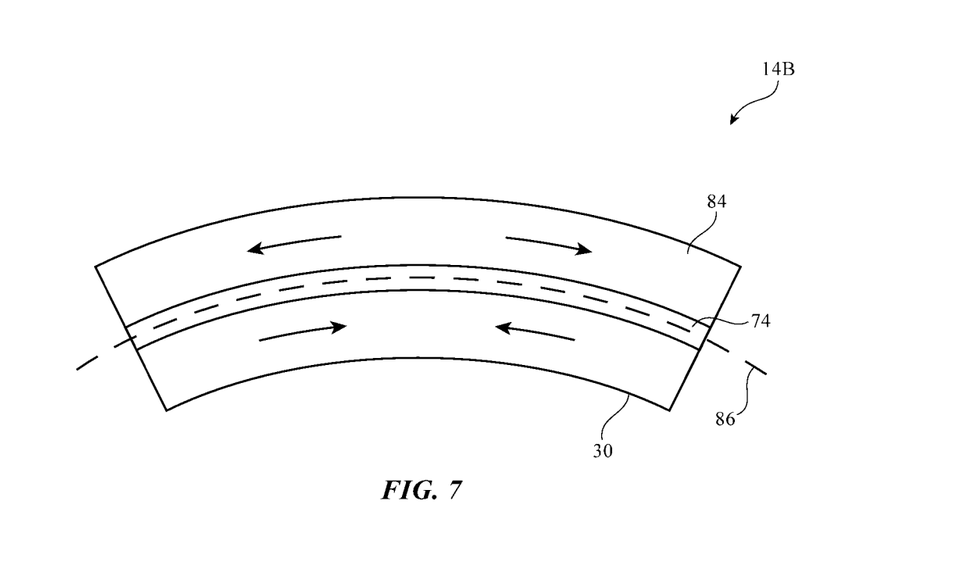
FIG. 7 is a cross-sectional side view of an illustrative bent substrate showing how a neutral stress plane may be aligned with metal traces on the substrate using a coating layer in accordance with an embodiment.

As shown in FIG. 7, when a portion of display 14 is bent in region 14B, some layers such as substrate 30 may be subjected to compressive stress and some layers such as coating layer 84 may be subjected to tensile stress. Neutral stress plane 86 arises where stress has been eliminated by balancing the compressive stress and tensile stress. The shape of neutral stress plane 86 may be curved in a curved portion of display 14 such as portion 14B of FIG. 7 (i.e., neutral stress plane 86 may have a curved profile).

The relative thicknesses of substrate 30 and coating 84 and the relative modulus of elasticity values for substrate 30 and coating 84 determine the location of the neutral stress plane within the layers of bent display region 14B. For example, if the elasticity of substrate 30 and coating 84 is the same, neutral stress plane 86 can be aligned with metal traces 74 by ensuring that coating 84 has the same thickness as substrate 30. If, on the other hand, coating 84 has an elasticity that is larger than that of substrate 30, coating 84 need not be as thick as substrate 30 to balance the compressive and tensile stresses.

Figure 8:
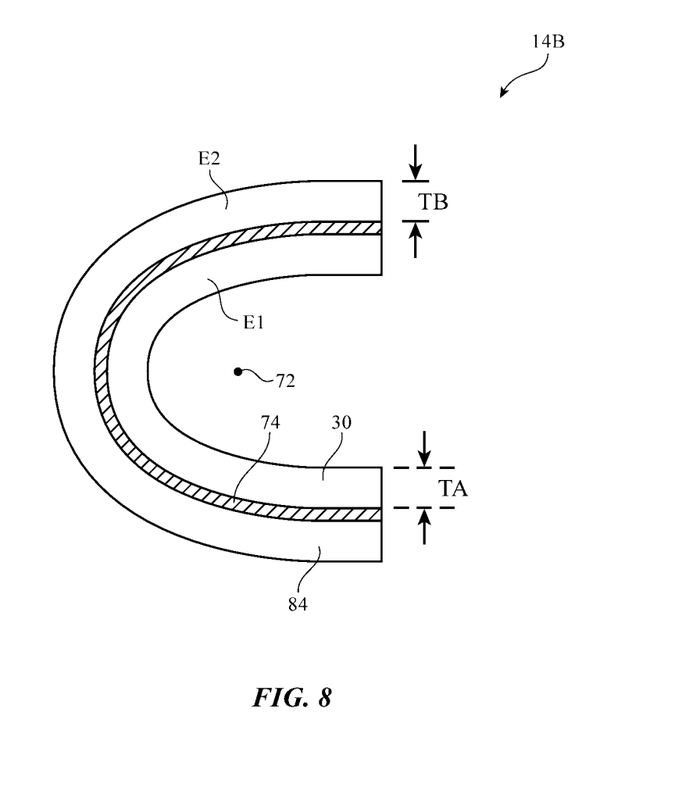
FIG. 8 is a cross-sectional side view of an illustrative display having a flexible substrate with a coating layer that has been bent in accordance with an embodiment.

FIG. 8 shows how coating 84 may be characterized by a thickness TB and elasticity E2 and how substrate 30 may be characterized by a thickness TA and elasticity E1. The elasticity values E1 and E2 and the thickness values TA and TB may be selected to help ensure that region 14B does not impart undesired stress to metal traces 74. For example, thickness TA may be minimized (e.g., TA may be less than 16 microns, may be 5-15 microns, may be 8 microns, may be 6-12 microns, may be more than 5 microns, etc.) and substrate elasticity E1 may be minimized (e.g., E1 may be less than 9 GPa, may be less than 7 GPa, may be less than 5 GPa, may be 2-3 GPa, may be 1-5 GPa, or may be more than 0.5 GPa) to make flexible substrate 30 more flexible than would otherwise be possible.

The thickness TB and elasticity E2 of coating 84 may be selected to balance the compressive stress produced when bending substrate 30. With one suitable arrangement, the elasticity E2 may be enhanced to help minimize the magnitude of thickness T2 (and therefore reduce display thickness). The value of E2 may be, for example, about 1 GPa, 0.7 to 1.3 GPa, more than 0.5 GPa, more than 0.7 GPa, more than 0.8 GPa, or less than 2 GPa (as examples). Substrate 30 may be, for example, polyimide and coating 84 may be, for example, a polymer adhesive that is thermally cured or that is cured by application of ultraviolet light.

Figure 9:
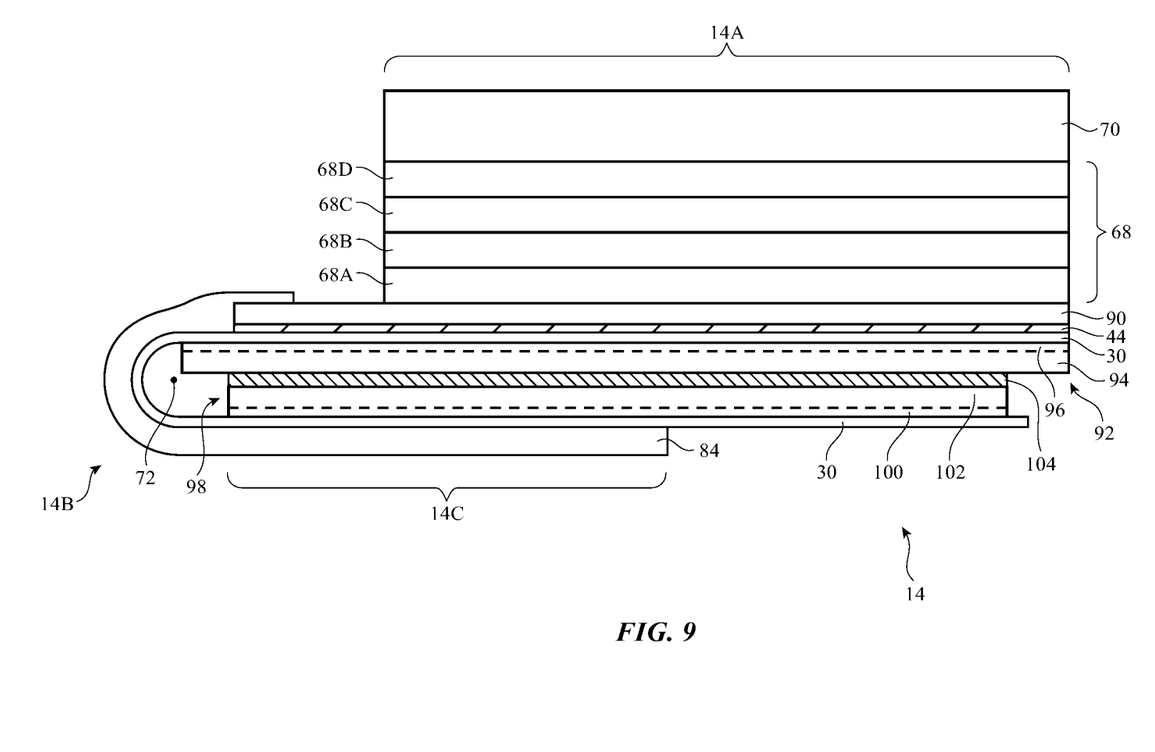
FIG. 9 is a cross-sectional side view of an illustrative display with a bent flexible substrate in accordance with an embodiment.

FIG. 9 is a cross-sectional side view of an illustrative arrangement that may be used for bending display 14 (e.g., when it is desired to omit mandrel 78 of FIG. 6). As shown in FIG. 9, display 14 may have active portion 14A, bent portion 14B, and inactive portion 14C. In active portion 14A, moisture barrier film 90 may cover the array of organic light-emitting diode pixels 22 and other thin-film transistor circuitry 44 to prevent moisture damage. Layers 68 may be interposed between cover layer 70 and moisture barrier layer 90. Layers 68 may include polarizer 68A (which may be attached to film 90 with pressure sensitive adhesive), optically clear adhesive layer 68B, touch sensor 68C, and optically clear adhesive 68D (as an example).

In region 14B, coating 84 may be used to adjust the location of the neutral stress plane in display 14 to avoid damage to metal traces 74.

Portion 14C may be bent under portion 14A and may be secured to the underside of portion 14A using layers such as layers 92 and 98. Layer 92 may include a polymer layer such as polymer substrate layer 94 and a pressure sensitive adhesive layer such as layer 96 that attaches layer 94 to substrate 30. Layer 98 may include a polymer layer such a polymer substrate 102 and a pressure sensitive adhesive layer such as layer 100 that attaches layer 102 to substrate 30. Adhesive layer 96 may be interposed between layers 92 and 98 and may attach layer 94 to layer 102, thereby attaching the folded portion of display 14 to itself. Layer 96 may be a foam adhesive, a layer of pressure sensitive adhesive, or other suitable adhesive. The thickness of layer 96 may be 30-250 microns, more than 25 microns, or less than 300 microns. The thickness of substrates 94 and 102 may be 100 microns, more than 50 microns, less than 150 microns, 70-130 microns, etc. The thickness of adhesive layers 96 and 100 may be 25 microns, more than 10 microns, less than 50 microns, etc.

Using an arrangement of the type shown in FIG. 9, display thickness can be minimized by allowing the display to be folded over against itself and attached together with adhesive (i.e., by allowing portion 14C to be folded and secured against portion 14A without use of a mandrel).

Figure 10:
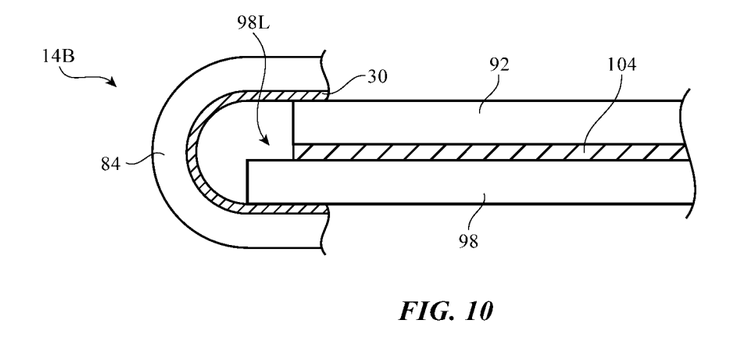
FIGS. 10, 11, and 12 are cross-sectional side views of illustrative layers in displays with bent flexible substrates in accordance with embodiments.
Figure 11:
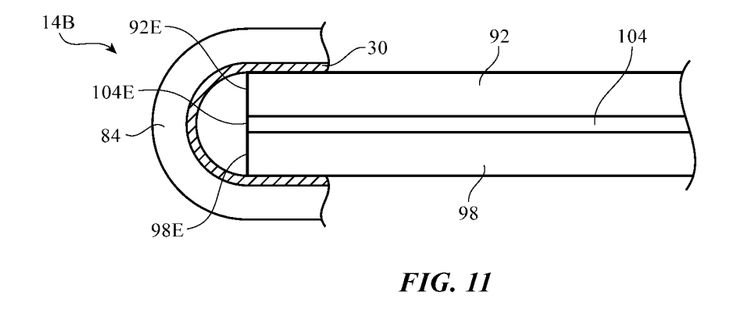
Figure 12:
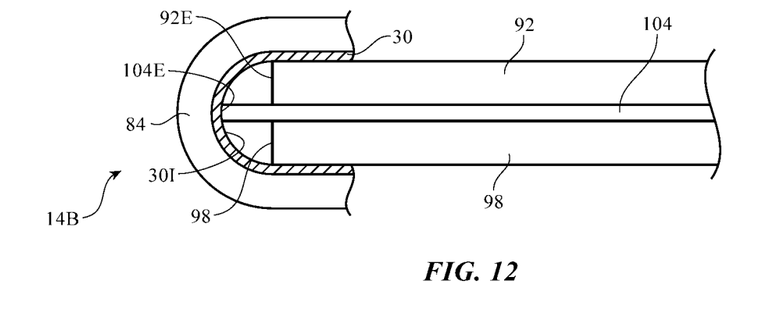

FIGS. 10, 11, and 12 are cross-sectional side views of additional configurations for the layers in displays with bent flexible substrates.

In the example of FIG. 10, layer 92 does not extend outwards as far as layer 98, so ledge portion 98L of layer 98 is exposed and the edges of layers 92 and 98 at the bent portion for display 14 are not aligned with each other. Arrangements of the type shown in FIG. 10 may help bend portion 14B of display 14 with a desired bend profile.

In the illustrative arrangement of FIG. 11, the edges of layers 98 and 92 (i.e., respective edge surfaces 98E and 92E) have been aligned with each other and have been aligned with edge surface (edge) 104E of adhesive layer 104. As with the arrangements of FIGS. 9 and 10, the use of this arrangement for layers 98 and 92 may be helpful in adjusting display 14 so that portion 14B exhibits a desired bend profile.

In some situations, it may be desirable for edge 104E of adhesive layer 104 to extend outwardly towards bent portion 14B of display 14 past edges 92E and 98E of layers 92 and 98. This type of arrangement is shown in FIG. 12. As shown in FIG. 12, adhesive layer 104 may protrude sufficiently far past edges 92E and 98E that edge surface 104E of layer 104 contacts and supports inner surface 301 of substrate 30. The use of a protruding adhesive layer such as layer 104 of FIG. 12 may help ensure that bent display portion 14B exhibits a desired bend profile.

Although sometimes described herein in the context of flexible displays, substrate 30 may be used to form any suitable devices. For example, circuitry may be formed on substrate 30 in regions 14A, 14B, and/or 14C that forms one or more touch sensors that are free of pixels (i.e., pixels 22 may be replaced by touch sensor electrodes, packaged sensors, or other sensor structures), that forms force sensors, or that forms other electrical components with or without including pixels on substrate 30. Thin-film circuitry and/or circuitry that forms part of a discrete device (e.g., integrated circuits etc.) may be formed on substrate 30 (e.g., in regions 14A, 14B, and/or 14C) and may include sensors, integrated circuits with sensor circuitry or other sensor structures, input-output circuitry, control circuitry, or other circuitry. If desired, the circuitry on substrate 30 may allow some or all of substrate 30 to serve as a signal cable (e.g., a flexible printed circuit cable that contains signal lines for routing signals between different portions of device 10). In arrangements such as these, metal traces may extend across bent region 14B to allow signal to pass between circuitry in regions 14A and 14C and, if desired, to route signals to and from circuitry in regions 14B. The use of a portion of substrate 30 in forming a display is merely illustrative.

The foregoing is merely illustrative and various modifications can be made by those skilled in the art without departing from the scope and spirit of the described embodiments. The foregoing embodiments may be implemented individually or in any combination.

What is claimed is:

1. A display, comprising:
   a flexible substrate having first and second portions and having a curved portion interposed between the first and second portions;
   an array of pixels on the first portion of the flexible substrate;
   metal traces on the flexible substrate that extend across the curved portion;
   first and second polymer layers interposed between the first and second portions of the flexible substrate, wherein the first and second polymer layers have respective first and second edge surfaces that face towards the curved portion of the flexible substrate; and
   an adhesive layer interposed between the first and second polymer layers, wherein the adhesive layer has a first surface that contacts the first polymer layer and a second surface that contacts the second polymer layer, wherein the adhesive layer has a third edge surface that faces towards the curved portion of the flexible substrate, and wherein a gap separates the curved portion of the flexible substrate from the first, second, and third edge surfaces.

2. The display defined in claim 1, further comprising:
   a first additional adhesive layer interposed between the first polymer layer and the second portion of the flexible substrate; and
   a second additional adhesive layer interposed between the second polymer layer and the first portion of the flexible substrate.

3. The display defined in claim 2, wherein the first polymer layer has a first thickness, wherein the second polymer layer has a second thickness that is equal to or greater than the first thickness, and wherein the adhesive layer has a third thickness that is less than the first and second thicknesses.

4. The display defined in claim 2, wherein the first polymer layer, the second polymer layer, the adhesive layer, the first additional adhesive layer, and the second additional adhesive layer are the only layers between the first and second portions of the flexible substrate.

5. The display defined in claim 1 wherein the first and second edge surfaces are planar.

6. The display defined in claim 1 wherein the first edge surface defines a first plane and the second edge surface defines a second plane that is parallel to the first plane.

7. A display, comprising:
   a flexible substrate having a first planar region, a second planar region, and a curved region interposed between the first and second planar regions;
   an array of pixels on the first planar region of the flexible substrate;
   first and second polymer layers interposed between the first and second planar regions of the flexible substrate;
   a first layer of adhesive having a first surface that contacts the first polymer layer and a second surface that contacts the second planar region of the flexible substrate;
   a second layer of adhesive having a third surface that contacts the second polymer layer and a fourth surface that contacts the first planar region of the flexible substrate; and
   a third layer of adhesive interposed between the first and second polymer layers, wherein the third layer of adhesive and the curved region of the flexible substrate are separated by a gap that extends under the second polymer layer.

8. The display defined in claim 7, further comprising metal traces on the flexible substrate that extend across the curved region.

9. The display defined in claim 8, wherein the first polymer layer has a first edge surface that faces towards the curved region, wherein the first layer of adhesive has second edge surface that faces towards the curved region, wherein the third layer of adhesive has a third edge surface that faces towards the curved region, and wherein the first, second, and third edge surfaces are coplanar.

10. The display defined in claim 9, wherein the second polymer layer has a fourth edge surface that faces towards the curved region, wherein the second adhesive layer has a fifth edge surface that faces towards the curved region, and wherein the fourth and fifth edge surfaces are coplanar.

11. The display defined in claim 10, wherein the gap separates the first, second, third, fourth, and fifth edge surfaces from the curved region.

12. The display defined in claim 7, further comprising:
a polymer coating on the curved region of the flexible substrate.

13. The display defined in claim 7, wherein the display does not include a mandrel.

14. An organic light-emitting diode display, comprising:
thin-film transistor circuitry that forms an array of pixels;
a flexible substrate having a first portion on which the array of pixels is located, a second portion that extends behind the first portion, and a curved portion between the first and second portions, wherein the organic light-emitting diode display does not include a mandrel between the first and second portions;
first and second polymer layers interposed between the first and second portions, wherein the first and second polymer layers have respective first and second planar edge surfaces that face towards the curved portion of the flexible substrate; and
a layer of adhesive interposed between the first and second polymer layers, wherein the layer of adhesive is the only layer between the first and second polymer layers and wherein the layer of adhesive is separated from the curved portion by a gap that extends above the first polymer layer.

15. The organic light-emitting diode display defined in claim 14, wherein the gap separates the first and second planar edge surfaces from the curved portion of the flexible substrate.

16. The organic light-emitting diode display defined in claim 15 further comprising:
a polymer coating on the curved portion of the flexible substrate.

17. The organic light-emitting diode display defined in claim 14, further comprising:
a first additional adhesive layer interposed between the first polymer layer and the second portion of the flexible substrate; and
a second additional adhesive layer interposed between the second polymer layer and the first portion of the flexible substrate.

18. The organic light-emitting diode display defined in claim 14, wherein the first and second planar edge surfaces are not aligned, and wherein the first polymer layer extends beyond and overlaps the second planar edge surface.

* * * * *